(12) United States Patent
Lee et al.

(10) Patent No.: US 7,282,987 B2
(45) Date of Patent: *Oct. 16, 2007

(54) INTERNAL VOLTAGE GENERATOR (75) Inventors: Kang-Seol Lee, Ichon-shi (KR); Jae-Hyuk Im, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/302,374

(22) Filed: Dec. 14, 2005

(65) Prior Publication Data

US 2006/0244514 A1 Nov. 2, 2006

(30) Foreign Application Priority Data

Apr. 30, 2005 (KR) ........................ 10-2005-0036548

(51) Int. Cl.
*G05F 1/10* (2006.01)
(52) U.S. Cl. ........................................ 327/536
(58) Field of Classification Search ................ 327/535, 327/536, 537
See application file for complete search history.

(56) References Cited

U.S. PATENT DOCUMENTS

| | | | | |
|---|---|---|---|---|
| 5,444,362 A | * | 8/1995 | Chung et al. ............... 323/313 |
| 5,677,645 A | * | 10/1997 | Merritt ........................ 327/536 |
| 5,939,935 A | * | 8/1999 | Merritt ........................ 327/536 |
| 6,150,860 A | | 11/2000 | Chun | |
| 6,366,482 B1 | * | 4/2002 | Jeong ........................... 363/60 |
| 6,507,237 B2 | * | 1/2003 | Hsu et al. .................... 327/538 |
| 6,563,746 B2 | | 5/2003 | Fujioka et al. | |
| 6,636,451 B2 | | 10/2003 | Park et al. | |
| 6,646,493 B2 | * | 11/2003 | Butler ......................... 327/536 |
| 6,833,752 B2 | * | 12/2004 | Merritt et al. ............... 327/536 |
| 6,867,641 B2 | | 3/2005 | Kang et al. | |
| 6,868,026 B2 | | 3/2005 | Fujioka | |
| 6,952,129 B2 | * | 10/2005 | Lin et al. ..................... 327/536 |
| 2005/0094479 A1 | | 5/2005 | Kim et al. | |

FOREIGN PATENT DOCUMENTS

| | | |
|---|---|---|
| JP | 2003-085977 | 3/2003 |
| KR | 10-2002-0084892 A | 11/2002 |

* cited by examiner

*Primary Examiner*—Jeffrey Zweizig
(74) *Attorney, Agent, or Firm*—McDermott Will & Emery LLP (57) ABSTRACT

An internal voltage generator for stably generating an internal voltage includes: a latch unit for generating a first and a second driving signals which have exact 180-degree phase difference based on a periodic signal, a first pump block for generating the internal voltage in response to the first driving signal, and a second pump block for generating the internal voltage in response to the second driving signal, wherein a level of the internal voltage is higher or equal to triple power supply voltage level.

18 Claims, 10 Drawing Sheets

INTERNAL VOLTAGE GENERATOR

FIELD OF THE INVENTION

The present invention relates to an internal voltage generator; and, more particularly, to an internal voltage generator for stably generating a high voltage.

DESCRIPTION OF RELATED ARTS

Generally, an internal voltage generator included in a semiconductor memory device generates various voltages used in the semiconductor memory device by using an external power supply voltage. Recently, the internal voltage generator is widely used in a dynamic random access memory (DRAM) as an operational voltage and a power consumption of the DRAM are decreased.

Meanwhile, since the internal voltage is internally generated, it is important to stably generate the internal voltage regardless of variations of process, temperature or pressure.

Figure 1:
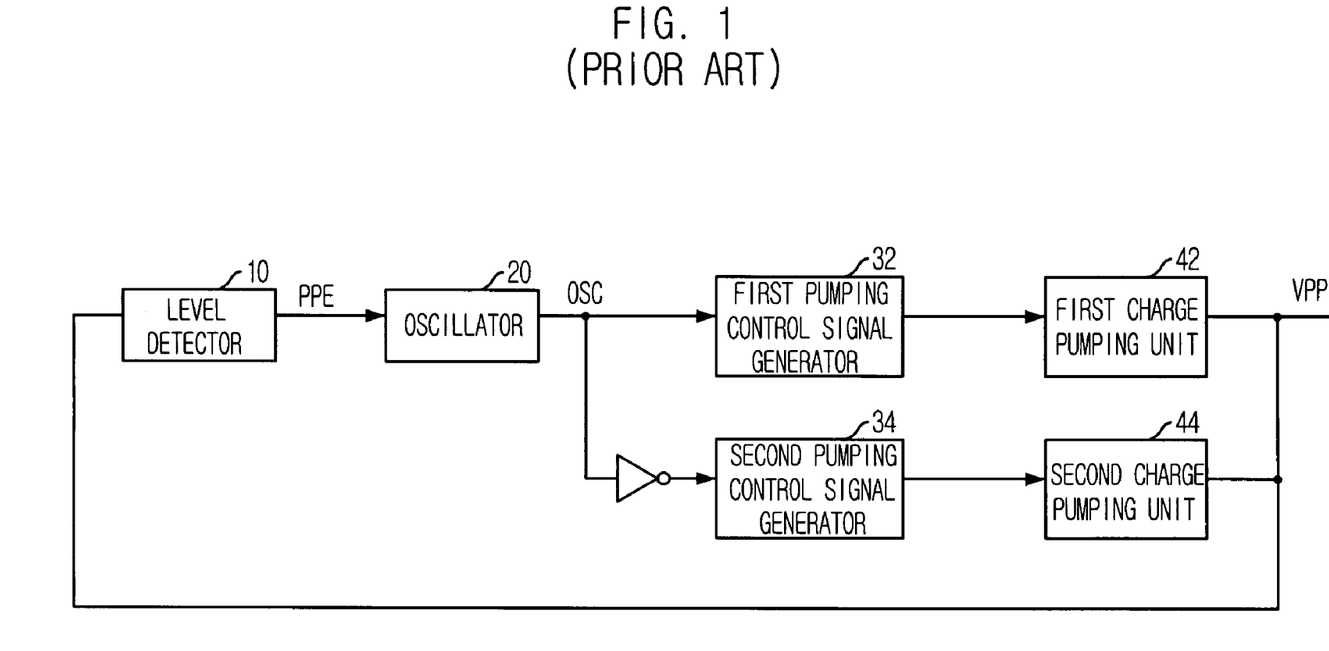
FIG. 1 is a block diagram showing a conventional internal voltage generator.

FIG. 1 is a block diagram showing a conventional internal voltage generator.

As shown, the internal voltage generator includes a level detector 10, an oscillator 20, a first pumping control signal generator 32, a second pumping control signal generator 34, a first charge pumping unit 42 and a second charge pumping unit 44.

The first and the second charge pumping units 42 and 44 perform a positive charge pumping operation to an external power supply voltage VDD in order to generate a high voltage VPP whose voltage level is higher than that of the external power supply voltage VDD.

The level detector 10 detects a voltage level of the high voltage VPP to thereby generate a detection signal PPE. The oscillator 20 generates a periodic signal OSC in response to the detection signal PPE.

The first pumping control signal generator 32 receives the periodic signal OSC to thereby generate a plurality of pumping control signals for controlling the first charge pumping unit 42. The second pumping control signal generator 34 receives an inverted periodic signal to thereby generate a plurality of pumping control signals for controlling the second charge pumping unit 44.

When a voltage level of the high voltage VPP is lower than a predetermined voltage level, the level detector 10 operates the first and the second charge pumping units 42 and 44 through the oscillator 20, the first and the second pumping control signal generators 32 and 34 in order to increase the high voltage VPP to the predetermined voltage level. In this manner, the high voltage VPP can have a constant voltage level.

Figure 2:
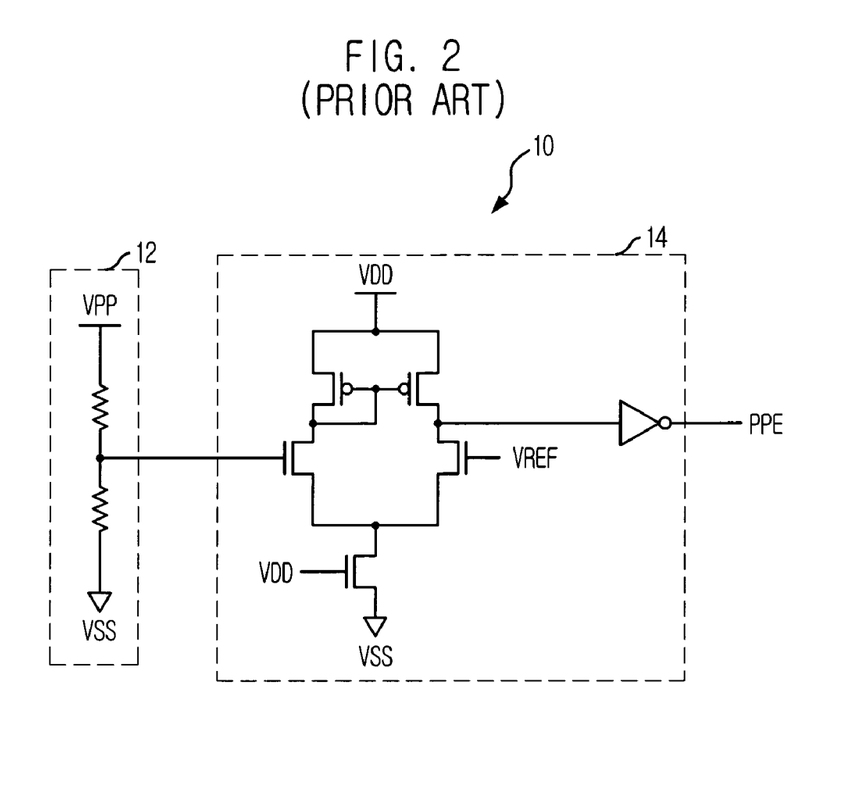
FIG. 2 is a schematic circuit diagram depicting the level detector shown in FIG. 1.

FIG. 2 is a schematic circuit diagram depicting the level detector 10 shown in FIG. 1.

As shown, the level detector 10 includes a voltage divider 12 having resistors connected in series for dividing a voltage level of the high voltage VPP; and a differential amplifier 14 for receiving an output of the voltage divider 12 and a reference voltage VREF as differential inputs to thereby generate the detection signal PPE.

The voltage divider 12 divides the high voltage VPP and outputs the divided voltage to the differential amplifier 14. Then, the differential amplifier 14 amplifies a voltage difference between the divided voltage and the reference voltage VREF to generate the detection signal PPE. That is, when the divided voltage is lower than the reference voltage VREF, the detection signal PPE is in a logic high level. Otherwise, the detection signal PPE is in a logic low level.

Figure 3:
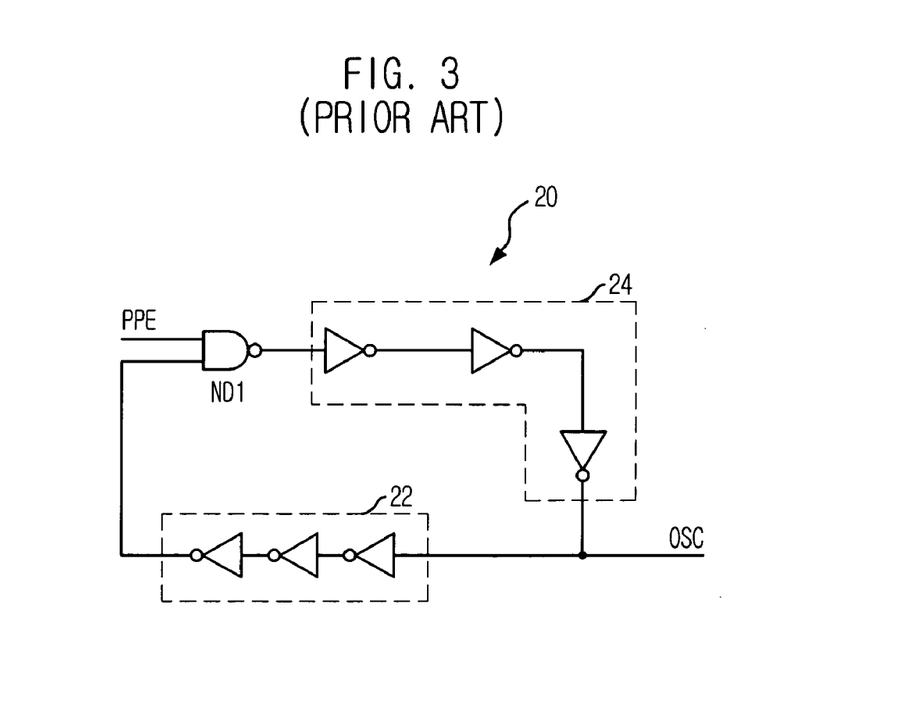
FIG. 3 is a schematic circuit diagram showing the oscillator shown in FIG. 1.

FIG. 3 is a schematic circuit diagram showing the oscillator 20 shown in FIG. 1.

As shown, the oscillator 20 includes a first inverter chain 22 for generating a feed-backed periodic signal by delaying and inverting the periodic signal OSC; a first NAND gate ND1 for receiving the feed-backed periodic signal and the detection signal PPE; and a second inverter chain 24 for generating the periodic signal OSC by delaying and inverting an output of the first NAND gate ND1.

As above-mentioned, the oscillator 20 generates the periodic signal OSC according to the detection signal PPE. That is, when the detection signal PPE is in a logic high level, the oscillator 20 generates the periodic signal OSC so that the periodic signal OSC toggles having a predetermined period. On the contrary, when the detection signal PPE is in a logic low level, the periodic signal OSC is in a logic low level.

Figure 4:
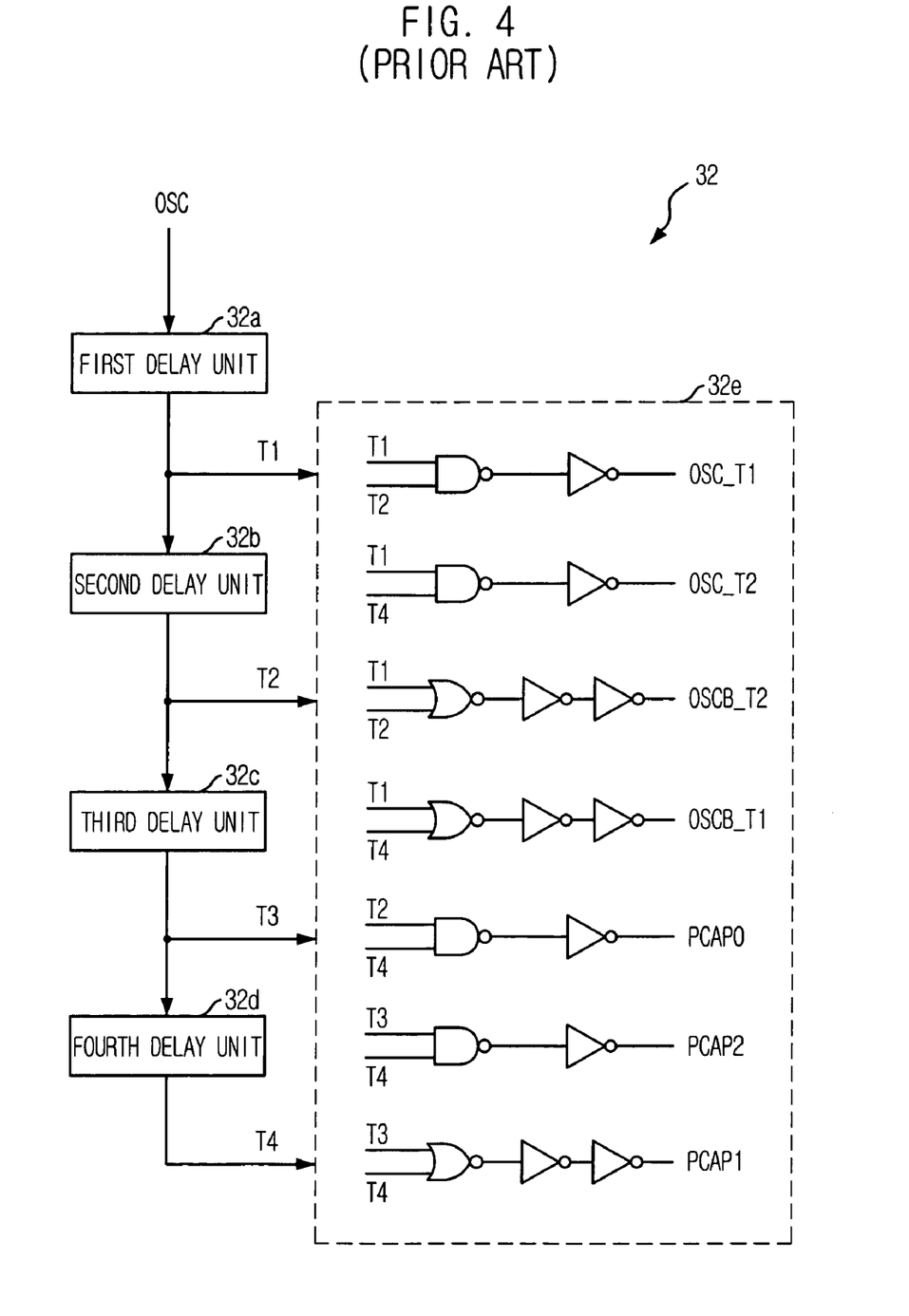
FIG. 4 is a schematic circuit diagram showing the first pumping control signal generator shown in FIG. 1.

FIG. 4 is a schematic circuit diagram showing the first pumping control signal generator 32 shown in FIG. 1. Herein, a structure of the second pumping control signal generator 34 is same to that of the first pumping control signal generator 32.

As shown, the first pumping control signal generator 32 includes a first to a fourth delay units 32a to 32d and a signal generation unit 32e.

The first delay unit 32a delays the periodic signal OSC to thereby generate a first delayed-periodic signal T1. The second delay unit 32b delays the first delayed-periodic signal T1 to thereby generate a second delayed-periodic signal T2. Similarly, the third delay unit 32c delays the second delayed-periodic signal T2 to thereby generate a third delayed-periodic signal T3, and the fourth delay unit 32d delays the third periodic signal T3 to thereby generate a fourth delayed-periodic signal T4.

The signal generation unit 32e receives the first to the fourth delayed-periodic signals T1 to T4 in order to generate a first to a seventh pumping control signals, i.e., OSC_T1, OSC_T2, OSCB_T2, OSCB_T1, PCAP0, PCAP1 and PCAP2.

Figure 5:
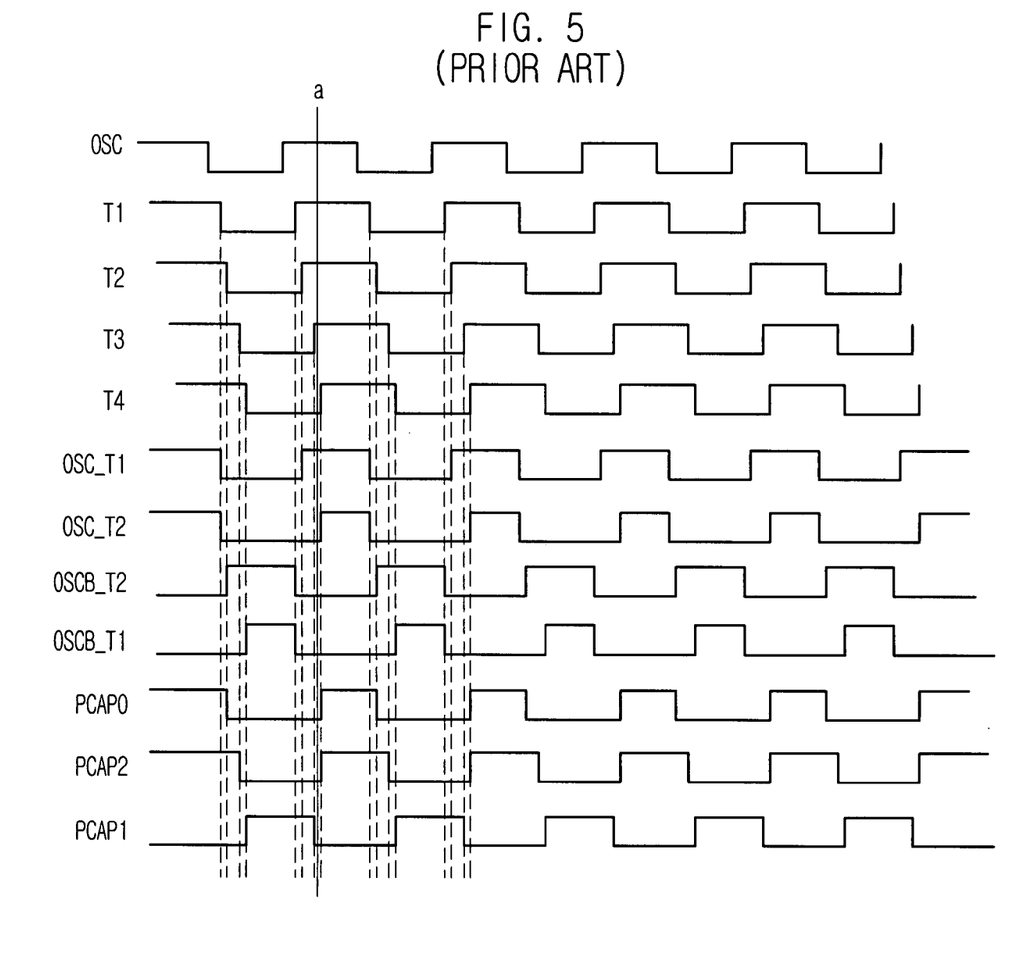
FIG. 5 is a wave diagram showing an operation of the first pumping control signal generator shown in FIG. 4.

FIG. 5 is a wave diagram showing an operation of the first pumping control signal generator 32 shown in FIG. 4.

As shown, the first to the fourth delayed-periodic signals T1 to T4 are generated by delaying the periodic signal OSC having different delay time. The first to the seventh pumping control signals OSC_T1 to PCAP2 are generated by performing logic operations to the first to the fourth delayed-periodic signals T1 to T4 so that activation periods of the first to the seventh pumping control signals OSC_T1 to PCAP2 do not overlap each other.

As above-mentioned, the second pumping control signal generator 34 has the same structure with the first pumping control signal generator 32. Therefore, since the second pumping control signal generator 34 receives the inverted periodic signal, pumping control signals generated by the second pumping control signal generator 34 have 180-degree phase difference in comparison with the first to the seventh pumping control signals OSC_T1 to PCAP2.

Figure 6:
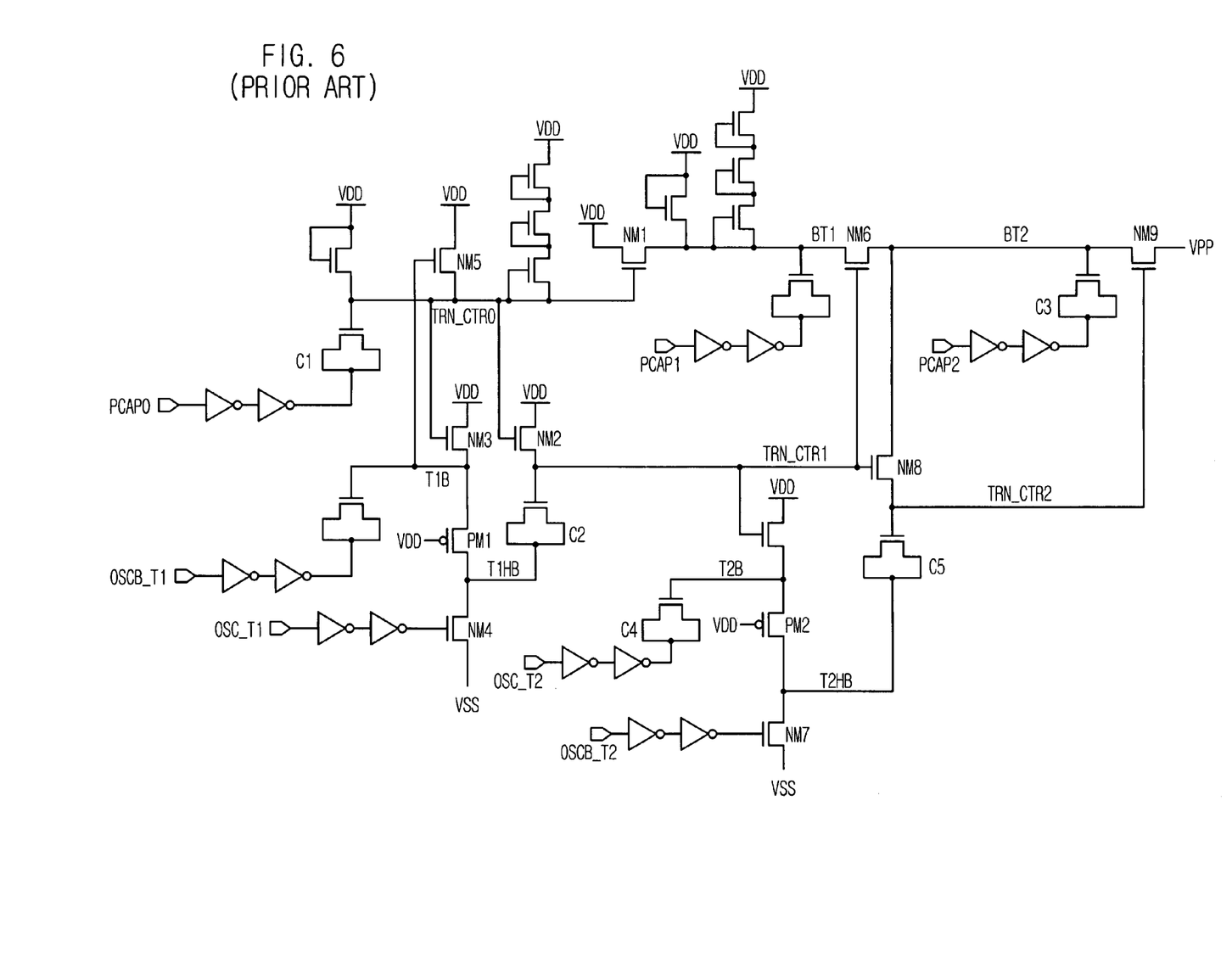
FIG. 6 is a schematic circuit diagram showing the first charge pumping unit shown in FIG. 1.

FIG. 6 is a schematic circuit diagram showing the first charge pumping unit 42 shown in FIG. 1. Herein, a structure of the second charge pumping unit 44 is same to that of the first charge pumping unit 42.

The first charge pumping unit 42 performs a pumping operation to the external power supply voltage VDD to generate the high voltage VPP in response to the first to the seventh pumping control signals OSC_T1 to PCAP2.

Referring to FIGS. 5 and 6, an operation of the first charge pumping unit 42 is described below. Herein, it is assumed that the operation of the first charge pumping unit 42 begins at the timing of 'a'.

Since the fifth pumping control signal PCAP0 has a voltage level of a power supply voltage VSS, i.e., the fifth pumping control signal PCAP0 is in a logic low level, a first node TRN_CTR0 has a voltage level of VDD-Vt.

Herein, it is assumed that a threshold voltage of a metal oxide semiconductor (MOS) transistor is Vt.

Thereafter, when the fifth pumping control signal PCAP0 transitions to a logic high level, i.e., to a voltage level of the external power supply voltage VDD, the first node TRN_CTR0 has a voltage level of 2 VDD-Vt due to a first capacitor C1. Therefore, a first to a third n-type metal oxide semiconductor (NMOS) transistors NM1 to NM3 whose each gate is coupled to the first node TRN_CTR0 are turned on. Accordingly, each voltage level of a second node BT1, a third node T1B and a fourth node TRN_CTR1 is increased to a voltage of the external power supply voltage VDD.

Thereafter, when a logic level of the first pumping control signal OSC_T1 is changed to a logic low level, a fourth NMOS transistor NM4 is turned off and, thus, a fifth node T1HB is disconnected from the power supply voltage VSS.

Thereafter, when the fourth pumping control signal OSCB_T2 is in a logic high level, a sixth node T2HB is grounded being connected to the power supply voltage VSS and a seventh node T2B has a voltage level of VDD-Vt.

Thereafter, when the sixth pumping control signal PCAP1 is in a logic high level, a voltage level of the second node BT1 is increased to a voltage level of 2 VDD. Meanwhile, since a logic level of the third pumping control signal OSCB_T1 is changed to a logic high level, a voltage level of the third node T1B is increased to a voltage level of 2 VDD and, thus, a fifth NMOS transistor NM5 and a first p-type metal oxide semiconductor (PMOS) transistor PM1 are turned on. Therefore, the first node TRN_CTR0 has a voltage level of the external power supply voltage VDD and a voltage level of the fifth node T1HB is increased to a voltage level of 2 VDD.

As the fifth node T1HB has a voltage level of 2 VDD, a second capacitor coupled to the fifth node T1HB increases a voltage of the fourth node TRN_CTR1 to a voltage level of 3 VDD. Accordingly, a sixth NMOS transistor NM6 whose gate is coupled to the fourth node TRN_CTR1 is turned on and, thus, an eighth node BT2 has a voltage level of 2 VDD. Therefore, the second and the eighth nodes BT1 and BT2 have the same voltage level.

Thereafter, when the fourth pumping control signal OSCB_T2 is in a logic low level, a seventh NMOS transistor NM7 is turned off and, thus, the sixth node T2HB is disconnected from the power supply voltage VSS. Also, an eighth NMOS transistor NM8 whose gate is coupled to the fourth node TRN_CTR1 is turned on so that a voltage level of a ninth node TRN_CTR2 is increased to a voltage level of 2 VDD.

Thereafter, when the seventh pumping control signal PCAP2 is in a logic high level, a third capacitor C3 increases a voltage level of the eighth node BT2 to a voltage level of 3 VDD. Also, since a logic level of the second pumping control signal OSC_T2 is changed to a logic high level, a fourth capacitor C4 increases a voltage level of the seventh node T2B to a voltage level of 2 VDD.

According to the voltage increment of the seventh node T2B, a second PMOS transistor PM2 is turned on and, thus, the sixth node T2HB has a voltage level of 2 VDD. Since the seventh node T2B and the sixth node T2HB have the same voltage level, a voltage level of the ninth node TRN_CTR2 is increased to a voltage level of 4 VDD by a fifth capacitor C5 coupled to the sixth node T2HB.

Therefore, a voltage level of 3 VDD loaded on the eighth node BT2 is outputted as the high voltage VPP by a ninth NMOS transistor NM9 whose gate is coupled to the ninth node TRN_CTR2.

In short, as above-mentioned, the first charge pumping unit 42 performs a positive pumping operation to the external power supply voltage VDD in response to the first to the seventh pumping control signals OSC_T1 to PCAP2, whereby a voltage which is three times higher than the external power supply voltage VDD is generated and, then, the generated voltage is outputted as the high voltage VPP.

Meanwhile, since the second charge pumping unit 44 receives the inverted periodic signal, the high voltage VPP is generated by the second charge pumping unit 44 when the first charge pumping unit 42 is not operated.

However, due to variations of manufacturing process or temperature, the periodic signal OSC and the inverted periodic signal may not have exact 180-degree phase difference. Accordingly, the high voltage VPP may be simultaneously generated by both of the first and the second charge pumping units 42 and 44, or the conventional internal voltage generator may fail to generate the high voltage VPP. Therefore, the high voltage VPP cannot hold a constant voltage level.

Also, there is a delay time between a point of time when a voltage level of the second node BT1 is increased to a voltage level of 2 VDD in response to a logic high level of the sixth pumping control signal PCAP1 and a point of time when a voltage level of the eighth node BT2 is increased to a voltage level of 3 VDD in response to a logic high level of the seventh pumping control signal PCAP2. The delay time is about a half of a period of a periodic signal. Herein, during the delay time, a leakage current may be generated and, thus, the high voltage VPP may not have a required voltage level.

Also, since a charge-pumped voltage loaded on a node is transferred by an NMOS transistor, a voltage which is higher than the charge-pumped voltage should be generated in order to compensate a voltage drop due to a threshold voltage of the NMOS transistor. For instance, for transferring a voltage level of 2 VDD loaded on the second node BT1 to the eighth node BT2 without a voltage drop, the fourth node TRN_CTR1 should have a voltage level of at least 2 VDD+Vt. Likewise, for transferring a voltage level of 3 VDD loaded on the eighth node BT2, the ninth node TRN_CTR2 should have a voltage level of at least 3 VDD+Vt.

Moreover, the voltage which is higher than the charge-pumped voltage stresses the NMOS transistor.

In addition, since the conventional internal voltage generator includes seven capacitors for each charge pumping unit, lots of gates should be included in order to generate pumping control signals for driving the seven capacitors. Accordingly, a size of the conventional internal voltage generator is increased.

SUMMARY OF THE INVENTION

It is, therefore, an object of the present invention to provide an internal voltage generator for stably generating a high voltage reducing a leakage current.

In accordance with an aspect of the present invention, there is provided an internal voltage generator, including: a latch unit for generating a first and a second driving signals which have exact 180-degree phase difference based on a periodic signal; a first pump block for generating the internal voltage in response to the first driving signal; and a second pump block for generating the internal voltage in response to the second driving signal, wherein a level of the internal voltage is higher or equal to triple power supply voltage level.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an internal voltage generator in accordance with the present invention will be described in detail referring to the accompanying drawings.

Figure 7:
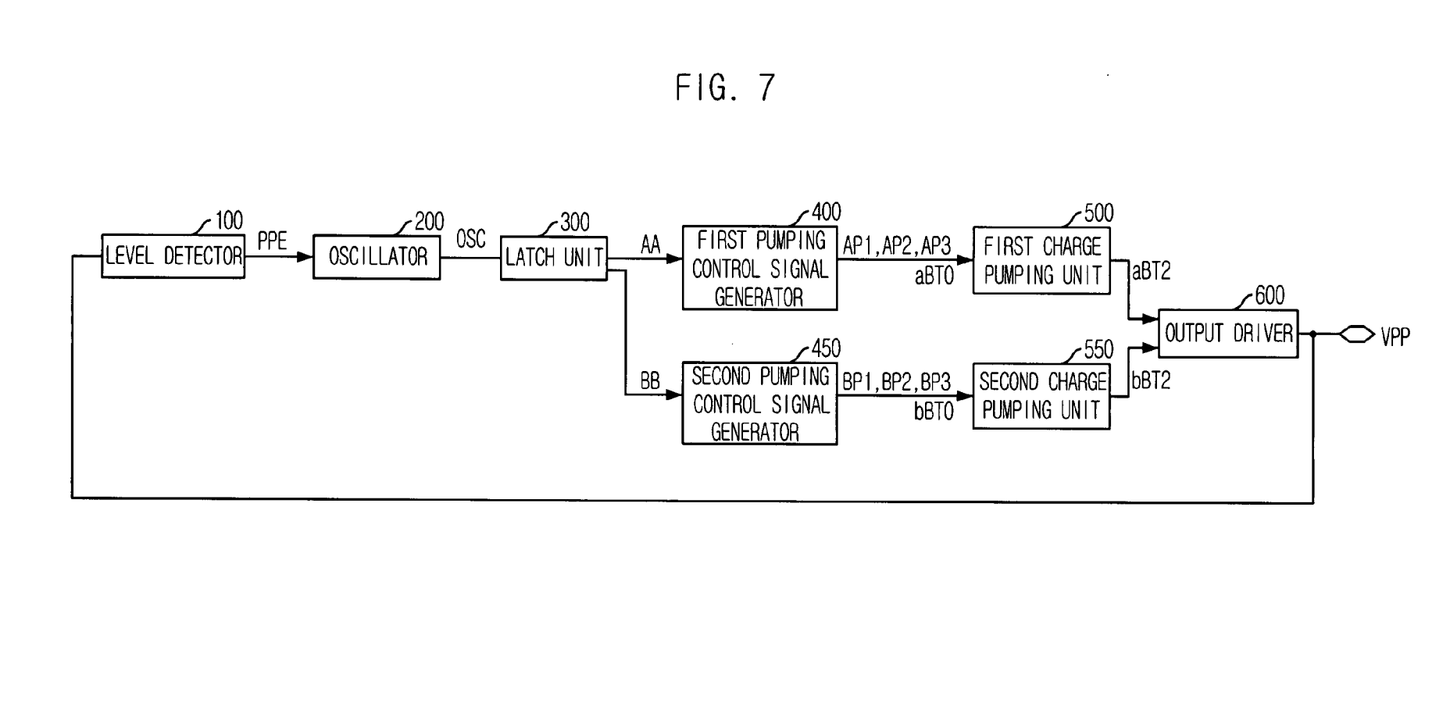
FIG. 7 is a block diagram showing an internal voltage generator in accordance with a preferred embodiment of the present invention.

FIG. 7 is a block diagram showing an internal voltage generator in accordance with a preferred embodiment of the present invention.

As shown, the internal voltage generator includes a level detector 100, an oscillator 200, a latch unit 300, a first pumping control signal generator 400, a second pumping control signal generator 450, a first charge pumping unit 500, a second charge pumping unit 550 and an output driver 600 The first and the second charge pumping units 500 and 550 perform a positive charge pumping operation to an external power supply voltage VDD in order to generate a voltage whose voltage level is higher than that of the external power supply voltage VDD. An output voltage of the first charge pumping unit 500 and an output voltage of the second charge pumping unit 550 are outputted as a high voltage VPP by turns by the output driver 600 according to the output voltages of the first and the second charge pumping units 500 and 550.

The level detector 100 detects a voltage level of the high voltage VPP to thereby generate a detection signal PPE. The oscillator 200 generates a periodic signal OSC in response to the detection signal PPE. The latch unit 300 receives the detection signal PPE in order to generate a first driving signal AA and a second driving signal BB. Herein, the first and the second driving signals AA and BB have opposite phase.

The first pumping control signal generator 400 generates a first to a fourth pumping control signals, i.e., AP1, AP2, AP3 and aBT0, for controlling the first charge pumping unit 500 in response to the first driving signal AA. The second pumping control signal generator 450 generates a fifth to an eighth pumping control signals, i.e., BP1, BP2, BP3 and bBT0, for controlling the second charge pumping unit 550 in response to the second driving signal BB.

Since the first and the second driving signals AA and BB have opposite phase, an operation period of the first charge pumping unit 500 dose not overlap with an operation period of the second charge pumping unit 550.

Figure 8:
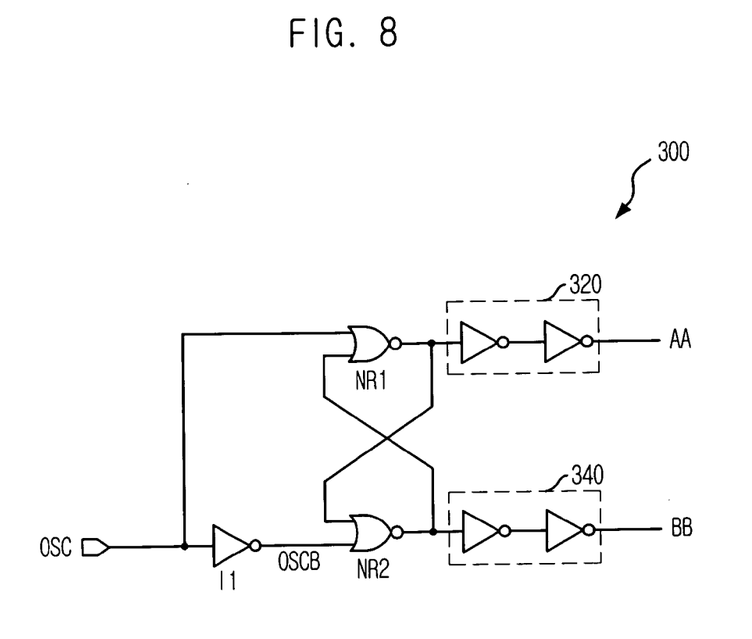
FIG. 8 is a schematic circuit diagram depicting the latch unit shown in FIG. 7.

FIG. 8 is a schematic circuit diagram depicting the latch unit 300 shown in FIG. 7.

As shown, the latch unit 300 includes a first inverter I1 for generating an inverted periodic signal OSCB by inverting the periodic signal OSC; a first NOR gate NR1 and a second NOR gate NR2 cross-coupled for respectively receiving the periodic signal OSC and the inverted periodic signal OSCB; a first buffer 320 for generating the first driving signal AA by buffering an output of the first NOR gate NR1; and a second buffer 340 for generating the second driving signal BB by buffering an output of the second NOR gate NR2.

When the periodic signal OSC is in a logic high level, the first and the second driving signals AA and BB are in a logic low level and a logic high level respectively. On the contrary, when the period signal OSC is in a logic low level, the first and the second driving signals AA and BB are in a logic high level and a logic low level respectively. Herein, since the first and the second driving signals AA and BB are generate by the cross-coupled NOR gates, i.e., the first and the second NOR gates NR1 and NR2, the first and the second driving signals AA and BB have 180-degree phase difference regardless of variations due to a manufacturing process.

Figure 9:
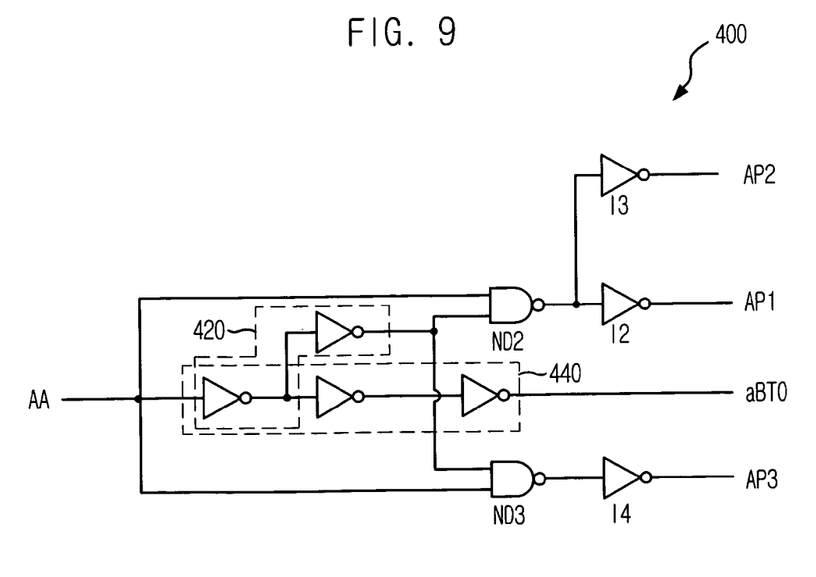
FIG. 9 is a schematic circuit diagram showing the first pumping control signal generator shown in FIG. 7.

FIG. 9 is a schematic circuit diagram showing the first pumping control signal generator 400 shown in FIG. 7. Herein, a structure of the second pumping control signal generator 450 is same to that of the first pumping control signal generator 400.

As shown, the first pumping control signal generator 400 includes a delay unit 420 for delaying the first driving signal AA; a first NAND gate ND1 for receiving the first driving signal AA and an output of the delay unit 420; a second inverter I2 for generating the first pumping control signal AP1 by inverting an output of the first NAND gate ND2; a third inverter I3 for generating the second pumping control signal AP2 by inverting the output of the first NAND gate ND2; an inverting unit 440 for generating the fourth pumping control signal aBT0 by delaying and inverting the first driving signal AA; a second NAND gate ND3 for receiving the output of the delay unit 420 and the first driving signal AA; and a fourth inverter I4 for generating the third pumping control signal by inverting an output of the second NAND gate ND3.

When the first driving signal AA is in a logic low level, the first to the third pumping control signals AP1 to AP3 are in a logic low level and the fourth pumping control signal aBT0 is in a logic high level. On the contrary, when the first driving signal AA is in a logic high level, the first to the third pumping control signals AP1 to AP3 are in a logic high level and the fourth pumping control signal aBT0 is in a logic low level.

Meanwhile, as above-mentioned, since the first and the second driving signals AA and BB have opposite phase, phases of the fifth to the eighth pumping control signals BP1 to bBT0 generated by the second pumping control signal generator 450 are opposite to those of the first to the fourth pumping control signals AP1 to aBT0.

Figure 10:
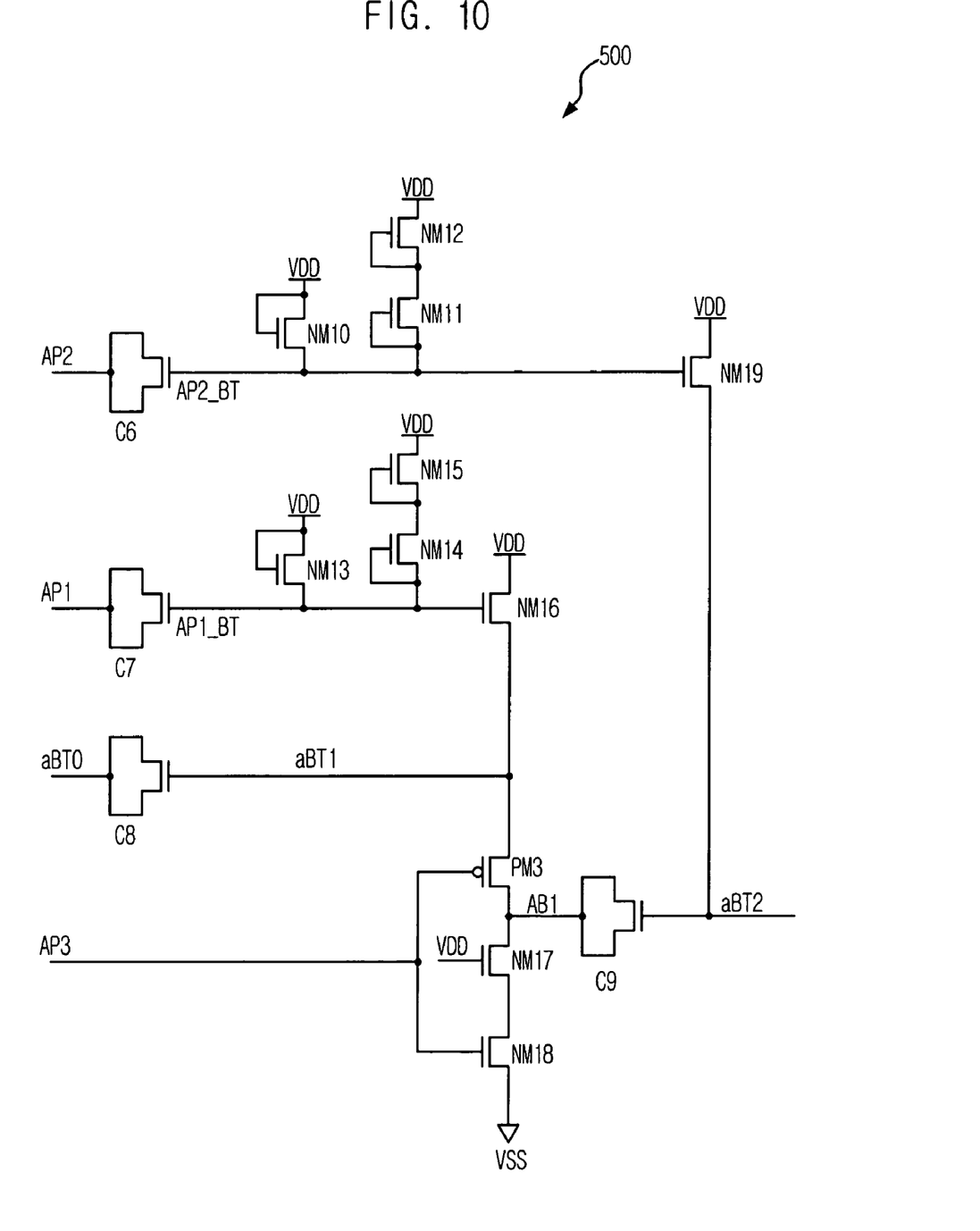
FIG. 10 is a first charge pumping unit shown in FIG. 7.

FIG. 10 is a first charge pumping unit 500 shown in FIG. 7.

As shown, the first charge pumping unit 500 includes a first to a fourth capacitors C6 to C9; a first to a tenth n-type metal oxide semiconductor (NMOS) transistor NM10 to NM19; and a first p-type metal oxide semiconductor (PMOS) transistor PM3.

The first capacitor C6 receives the second pumping control signal AP2 through one terminal of the first capacitor C6. A drain and a gate of the first NMOS transistor NM10 are coupled to the external power supply voltage VDD and a source of the first NMOS transistor NM10 is coupled to the other terminal of the first capacitor C6. A gate and a source of the second NMOS transistor NM11 are coupled to the other terminal of the first capacitor C6. A drain of the third NMOS transistor NM12 is coupled to the external power supply voltage VDD and a gate and a source of the third NMOS transistor NM12 are coupled to a drain of the second NMOS transistor NM11.

The second capacitor C7 receives the first pumping control signal AP1 through one terminal of the second capacitor C7. A drain and a gate of the fourth NMOS transistor NM13 are coupled to the external power supply voltage VDD and a source of the fourth NMOS transistor NM13 is coupled to the other terminal of the second capacitor C7. A gate and a source of the fifth NMOS transistor NM14 are coupled to the other terminal of the second capacitor C7. A drain of the sixth NMOS transistor NM15 is coupled to the external power supply voltage VDD and a gate and a source of the sixth NMOS transistor NM15 are coupled to a drain of the fifth NMOS transistor NM14.

The third capacitor C8 receives the fourth pumping control signal aBT0 through one terminal of the third capacitor C8. A gate of the seventh NMOS transistor NM16 is connected to the other terminal of the second capacitor C7 and a drain-source path of the seventh NMOS transistor NM16 is connected between the external power supply voltage VDD and the other terminal of the third capacitor C8. A gate of the first PMOS transistor PM8 receives the third pumping control signal AP3 and a source-drain path of the first PMOS transistor PM8 is connected between the other terminal of the third capacitor C8 and a node AB1. A gate of the ninth NMOS transistor NM18 receives the third pumping control signal AP3 and a source of the ninth NMOS transistor NM18 is coupled to a power supply voltage VSS. A gate of the eighth NMOS transistor NM17 is coupled to the external power supply voltage VDD and a drain-source path of the eighth NMOS transistor NM17 is connected between the node AB1 and a drain of the ninth NMOS transistor NM18.

One terminal of the fourth capacitor C9 is coupled to the node AB1 and the other terminal of the fourth capacitor C9 outputs a first output voltage aBT2. A gate of the tenth NMOS transistor NM19 is coupled to the other terminal of the first capacitor C6 and a drain-source path of the tenth NMOS transistor NM19 is connected between the external power supply voltage VDD and the other terminal of the fourth capacitor C9.

Meanwhile, a circuit for precharging/charging the node AB1 includes not only a single PMOS transistor and a single NMOS transistor, i.e., the first PMOS transistor PM3 and the ninth NMOS transistor NM18, but also another NMOS transistor, i.e., the eighth NMOS transistor NM17, connected between the first PMOS transistor PM3 and the ninth NMOS transistor NM18. Therefore, when the third pumping control signal AP3 is in a logic low level and a voltage level of the node AB1 is increased to a voltage level of 2 VDD, a generated off-leakage current can be reduced.

Figure 11:
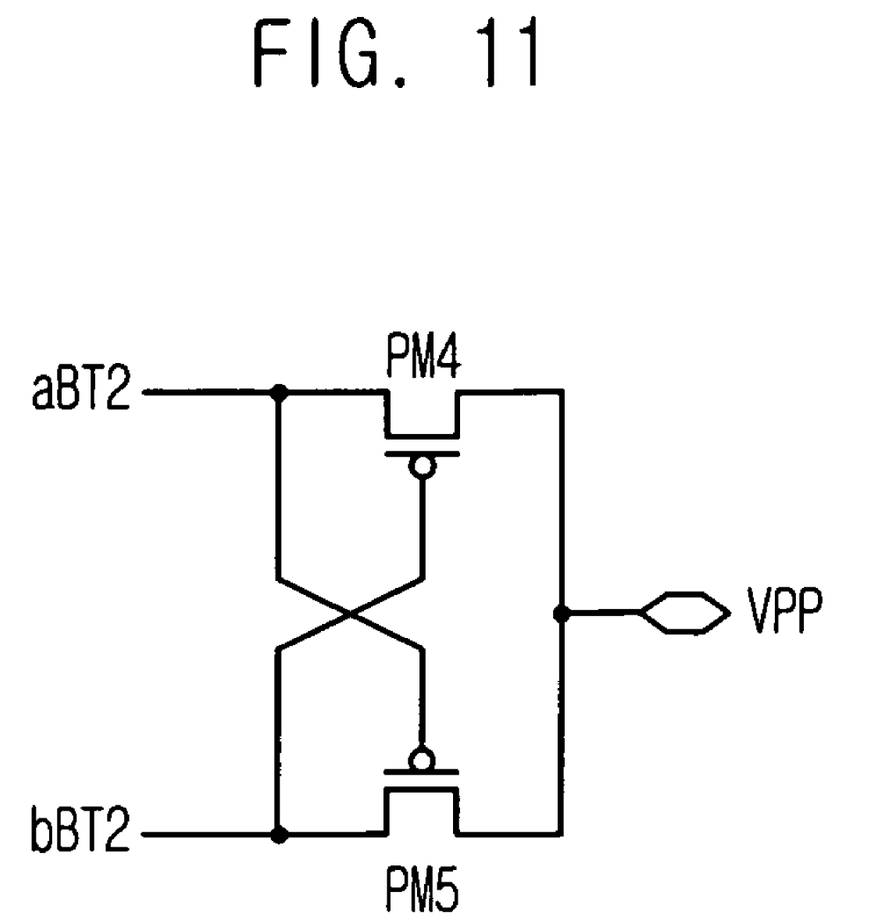
FIG. 11 is a schematic circuit diagram showing the output driver shown in FIG. 7.

FIG. 11 is a schematic circuit diagram showing the output driver 600 shown in FIG. 7.

As shown, the output driver 600 includes a second PMOS transistor PM4 for outputting the first output voltage aBT2 as the high voltage VPP in response to a second output voltage bBT2 generated by the second charge pumping unit 550; and a third PMOS transistor PM5 for outputting the second output voltage bBT2 as the high voltage VPP in response to the first output voltage aBT2.

As above-mentioned, a gate of the second PMOS transistor PM4 receives an input voltage, i.e., the second output voltage bBT2, of the third PMOS transistor PM5 and a gate of the third PMOS transistor PM5 receives an input voltage, i.e., the first output voltage aBT2, of the second PMOS transistor PM4. Therefore, when a voltage difference between the first and the second output voltages aBT2 and bBT2 is lower than a threshold voltage, a relatively higher voltage is outputted.

Figure 12:
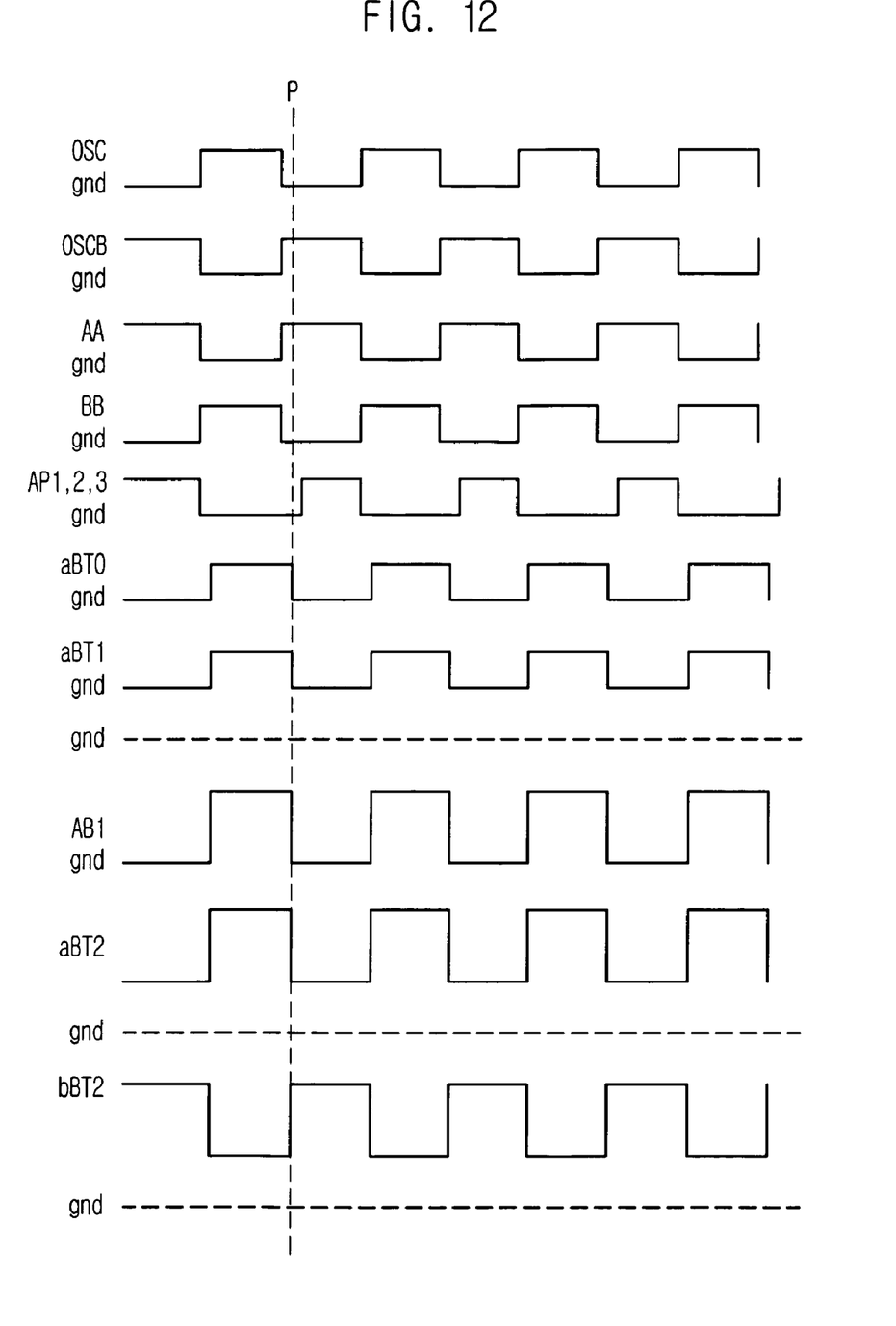
FIG. 12 is a wave diagram showing an operation of the internal voltage generator shown in FIG. 7.

FIG. 12 is a wave diagram showing an operation of the internal voltage generator.

Referring to FIGS. 7 to 12, the operation of the internal voltage generator is described below.

Herein, it is assumed that the high voltage VPP is lower than a reference voltage VREF so that the detection signal PPE is activated and the oscillator 200 constantly generates the periodic signal OSC. The description of the operation of the internal voltage generator begins at the timing 'P'.

The latch unit 300 outputs the first driving signal AA and the second driving signal BB as a logic high level and a logic low level respectively in response to a logic low level of the periodic signal OSC. At this time, since the first pumping control signal generator 400 outputs the fourth pumping control signal aBT0 as a logic low level in response to the first driving signal AA, a node aBT1 has a voltage level of the external power supply voltage VDD. Also, since the first to the third pumping control signals AP1 to AP3 are in a logic low level, nodes AP2_BT and AP1_BT have a voltage level of VDD-Vt and the node AB1 has a voltage level of 2 VDD.

Thereafter, when the first to the third pumping control signals AP1 to AP3 are in a logic high level, a positive pumping operation is performed to the nodes AP2_BT and AP1_BT by the first capacitor C6 and the second capacitor C7 respectively so that each voltage level of the nodes AP2_BT and AP1_BT is increased to a voltage level of 2 VDD-Vt. Also, the ninth NMOS transistor NM18 is turned on by the third pumping control signal AP3 and, thus, the node has a voltage level of the power supply voltage VSS.

Accordingly, the tenth NMOS transistor NM19 and the seventh NMOS transistor NM16 whose gates are respectively coupled to the node AP2_BT and the node AP1_BT are turned on and, thus, the node aBT1 and the first output voltage aBT2 have a voltage level of the external power supply voltage VDD.

Thereafter, since the latch unit 300 outputs the first driving signal AA as a logic low, the first to the third pumping control signals AP1 to AP3 are in a logic low level. Therefore, the seventh NMOS transistor NM16 and the tenth NMOS transistor NM19 are turned off and, thus, the node aBT1 and the first output voltage aBT2 are disconnected from the external power supply voltage VDD. Also, since the first PMOS transistor PM3 is turned off in response to the third pumping control signal AP3, the node AB1 has the same voltage level with the node aBT1, i.e., the node AB1 has a voltage level of the external power supply voltage VDD. Accordingly, the fourth capacitor C9 increases the first output voltage aBT2 to a voltage level of 2 VDD by performing a positive pumping operation.

Thereafter, since the fourth pumping control signal aBT0 is in a logic high level, the node aBT1 has a voltage level of 2 VDD. Also, since a voltage level of the node aBT1 is transferred to the node AB1 by the first PMOS transistor PM3, a voltage level of the first output voltage aBT2 is increased to a voltage level of 3 VDD by the fourth capacitor C9.

Herein, although not shown, since the fifth to the eighth pumping control signals, i.e., BP1 to bBT0, have an opposite phase in comparison with the first to the fourth pumping control signals AP1 to aBT0, the second charge pumping unit 550 generates the second output voltage bBT2 when the first charge pumping unit 500 is not operated.

Meanwhile, since the driving control signals, i.e., AA and BB, are generated having 180-degree phase difference and an output driver is provided, it is prevented that driving periods of the first and the second charge pumping units are overlapped each other or no output is generated. Accordingly, a high voltage can hold a stable voltage level.

Also, since the number of capacitors can be reduced and, thus, the number of pumping control signals is reduced, a size of a charge pumping unit and a pumping control signal generator can be reduced.

Further, according to the conventional internal voltage generator, a delay time of a half period of a periodic signal is required for increasing a voltage level of the high voltage from 2 VDD to 3 VDD. However, in accordance with the present invention, since a pumping operation for increasing the high voltage from 2 VDD to 3 VDD is controlled by the fourth pumping control signal aBT0, the delay time required for the voltage increment can be dramatically reduced. Accordingly, since a leakage current due to the delay time can be reduced, the high voltage can be generated more efficiently.

Furthermore, since an output driver is embodied with a PMOS transistor, a voltage required to be higher than a pumped voltage for outputting the pumped voltage is not necessary. Accordingly, a stress of a transistor can be reduced and, thus, the internal voltage generator can be operated more stably.

The present application contains subject matter related to Korean patent application No. 2005-36548, filed in the Korean Patent Office on Apr. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for stably generating an internal voltage, comprising:
a latch unit for generating a first and a second driving signals which have exact 180-degree phase difference based on a periodic signal;
a first pump block for generating the internal voltage in response to the first driving signal; and
a second pump block for generating the internal voltage in response to the second driving signal,
wherein the first pump block includes:
a first pumping control signal generation unit for generating a first control signal in response to the first driving signal; and
a first charge pumping unit for performing a positive pumping operation to a first power supply voltage in response to the first control signal in order to generate the internal voltage,
wherein the first charge pumping unit includes:
a first p-type metal oxide semiconductor (PMOS) transistor coupled to a first node and having a gate receiving the first control signal;
a first n-type metal oxide semiconductor (NMOS) transistor coupled to a second power supply voltage and having a gate receiving the first control signal,
a blocking NMOS transistor coupled between the first node and the first NMOS transistor and having a gate receiving the first power supply voltage; and
a first capacitor coupled between the first node and an output node for outputting an output voltage.

2. The internal voltage generator as recited in claim 1, wherein a level of the internal voltage is higher or equal to triple first power supply voltage level.

3. The internal voltage generator as recited in claim 2, further comprising:
a level detection unit for detecting a voltage level of the internal voltage in order to generate a detection signal; and
an oscillator for generating the periodic signal in response to the detection signal.

4. The internal voltage generator as recited in claim 3, further comprising an output driver for selectively outputting outputs of the first pump block and the second pump black as the internal voltage.

5. The internal voltage generator as recited in claim 4, wherein the second pump block includes:
a second pumping control signal generation unit for generating a second control signal in response to the second driving signal; and
a second charge pumping unit for performing a positive pumping operation to the first power supply voltage in response to the second control signal in order to generate the internal voltage.

6. The internal voltage generator as recited in claim 5, wherein, the output driver includes;
a second p-type metal oxide semiconductor (PMOS) transistor for outputting the output voltage of the first charge pumping unit as a high voltage in response to the output voltage of the second charge pumping unit; and
a third PMOS transistor for outputting the output voltage of the second charge pumping unit as the high voltage in response to the output voltage of the first charge pumping unit.

7. The internal voltage generator as recited in claim 1, wherein the first control signal includes a plurality of pumping control signals and the first charge pumping unit includes:
a second capacitor for receiving a first pumping control signal through one terminal of the second capacitor;
a second n-type metal oxide semiconductor (NMOS) transistor whose drain and gate are coupled to the first power supply voltage, wherein a source of the second NMOS transistor is coupled to the other terminal of the second capacitor;
a third NMOS transistor whose gate and source are coupled to the other terminal of the second capacitor;

a fourth NMOS transistor whose drain is coupled to the first power supply voltage, wherein a gate and a source of the fourth NMOS transistor are coupled to a drain of the third NMOS transistor, a third capacitor for receiving a second pumping control signal through one terminal of the third capacitor;

a fifth NMOS transistor whose drain and gate are coupled to the first power supply voltage, wherein a source of the fifth NMOS transistor is coupled to the other terminal of the third capacitor;

a sixth NMOS transistor whose gate and source are coupled to the other terminal of the third capacitor;

a seventh NMOS transistor whose drain is coupled to the first power supply voltage, wherein a gate and a source of the seventh NMOS transistor are coupled to a drain of the NMOS transistor;

a fourth capacitor receiving a third pumping control signal through one terminal of the fourth capacitor;

an eighth NMOS transistor whose gate is connected to the other terminal of the third capacitor, wherein a drain-source path of the eighth NMOS transistor is connected between the first power supply voltage and the other terminal of the fourth capacitor;

the first PMOS transistor whose gate receives a fourth pumping control signal, wherein a source-drain path of the first PMOS transistor is connected between the other terminal of the fourth capacitor and the first node;

the first NMOS transistor whose gate receives the fourth pumping control signal, wherein a source of the first NMOS transistor is coupled to the second power supply voltage;

the blocking NMOS transistor whose gate is coupled to the first power supply voltage, wherein a drain-source path of the blocking NMOS transistor is connected between the first node and a drain of the first NMOS transistor;

the first capacitor whose one terminal is coupled to the first node, wherein the other terminal of the first capacitor outputs the output voltage; and a ninth NMOS transistor whose gate is coupled to the other terminal of the second capacitor, wherein a drain-source path of the ninth NMOS transistor is connected between the first power supply voltage and the other terminal of the first capacitor.

8. The internal voltage generator as recited in claim 1, wherein the latch unit includes:
   a first inverter for inverting the periodic signal;
   a first NOR gate and a second NOR gate cross-coupled for receiving the periodic signal and an output of the first inverter;
   a first buffer for generating the first driving signal by buffering an output of the first NOR gate; and
   a second buffer for generating the second driving signal by buffering an output of the second NOR gate.

9. The internal voltage generator as recited in claim 7, wherein the first pumping control signal generator includes:
   a delay unit for delaying the first driving signal;
   a first NAND gate for receiving the first driving signal and an output of the delay unit;
   a second inverter for generating the first pumping control signal by inverting an output of the first NAND gate;
   a third inverter for generating the second pumping control signal by inverting the output of the first NAND gate;
   an inverting unit for generating the third pumping control signal by delaying and inverting the first driving signal;
   a second NAND gate for receiving the output of the delay unit and the first driving signal; and
   a fourth inverter for generating the fourth pumping control signal by inverting an output of the second NAND gate.

10. An internal voltage generator, comprising:
    a latch unit for generating a first and a second driving signals which have exact 180-degree phase difference based on a periodic signal;
    a first pump block for generating an internal voltage in response to the first driving signal; and
    a second pump block for generating the internal voltage in response to the second driving signal,
    wherein the first pump block includes:
    a first pumping control signal generation unit for generating a first control signal in response to the first driving signal; and
    a first charge pumping unit for performing a positive pumping operation to a first power supply voltage in response to the first control signal in order to generate the internal voltage,
    wherein the first charge pumping unit includes a blocking metal oxide semiconductor (MOS) transistor having a gate receiving the first power supply voltage so as to prevent a leakage current flowing into a second power supply voltage.

11. The internal voltage generator as recited in claim 10, wherein a level of the internal voltage is higher or equal to triple first power supply voltage level.

12. The internal voltage generator as recited in claim 10, further comprising:
    a level detection unit for detecting a voltage level of the internal voltage in order to generate a detection signal; and
    an oscillator for generating the periodic signal in response to the detection signal.

13. The internal voltage generator as recited in claim 10, further comprising an output driver for selectively outputting outputs of the first pump block and the second pump block as the internal voltage.

14. The internal voltage generator as recited in claim 13, wherein, the output driver includes:
    a first p-type metal oxide semiconductor (PMOS) transistor for outputting the output voltage of the first charge pumping unit as a high voltage in response to the output voltage of the second charge pumping unit; and
    a second PMOS transistor for outputting the output voltage of the second charge pumping unit as the high voltage in response to the output voltage of the first charge pumping unit.

15. The internal voltage generator as recited in claim 10, wherein the second pump block includes:
    a second pumping control signal generation unit for generating a second control signal in response to the second driving signal; and
    a second charge pumping unit for performing a positive pumping operation to the first power supply voltage in response to the second control signal in order to generate the internal voltage.

16. The internal voltage generator as recited in claim 10, wherein the latch unit includes:
    a first inverter for inverting the periodic signal;
    a first NOR gate and a second NOR gate cross-coupled for receiving the periodic signal and an output of the first inverter;
    a first buffet for generating the first driving signal by buffering an output of the first NOR gate; and a second buffer for generating the second driving signal by buffering an output of the second NOR gate.

17. The internal voltage generator as recited in claim 10, wherein the first control signal includes a plurality of pumping control signals and the first charge pumping unit includes:
- a first capacitor for receiving a first pumping control signal through one terminal of the first capacitor;
- a first n-type metal oxide semiconductor (NMOS) transistor having a drain and a gate coupled to the first power supply voltage, and a source coupled to the other terminal of the first capacitor;
- a second NMOS transistor whose gate and source are coupled to the other terminal of the first capacitor;
- a third NMOS transistor having a drain coupled to the first power supply voltage, and a gate and a source coupled to a drain of the second NMOS transistor;
- a second capacitor for receiving a second pumping control signal through one terminal of the second capacitor;
- a fourth NMOS transistor having a drain and a gate coupled to the first power supply voltage, and a source coupled to the other terminal of the second capacitor;
- a fifth NMOS transistor whose gate and source are coupled to the other terminal of the second capacitor;
- a sixth NMOS transistor having a drain coupled to the first power supply voltage, and a gate and a source coupled to a drain of the fifth NMOS transistor;
- a third capacitor receiving a third pumping control signal through one terminal of the third capacitor;
- a seventh NMOS transistor having a gate coupled to the other terminal of the second capacitor, and a drain-source path connected between the first power supply voltage and the other terminal of the third capacitor;
- a PMOS transistor having a gate receiving a fourth pumping control signal and a source-drain path connected between the other terminal of the third capacitor and a first node;
- an eighth NMOS transistor having a gate receiving the fourth pumping control signal and a source coupled to the second power supply voltage;
- the blocking MOS transistor having a gate coupled to the first power supply voltage and a drain-source path connected between the first node and a drain of the eighth NMOS transistor;
- a fourth capacitor whose one terminal is coupled to the first node, wherein the other terminal of the fourth capacitor outputs the output voltage; and
- a ninth NMOS transistor having a gate coupled to the other terminal of the first capacitor and a drain-source path connected between the first power supply voltage and the other terminal of the fourth capacitor.

18. The internal voltage generator as recited in claim 17, wherein the first pumping control signal generator includes:
- a delay unit for delaying the first driving signal;
- a first NAND gate for receiving the first driving signal and an output of the delay unit
- a second inverter for generating the first pumping control signal by inverting an output of the first NAND gate;
- a third inverter for generating the second pumping control signal by inverting the output of the first NAND gate;
- an inverting unit for generating the third pumping control signal by delaying and inverting the first driving signal;
- a second NAND gate for receiving the output of the delay unit and the first driving signal; and
- a fourth inverter for generating the fourth pumping control signal by inverting an output of the second NAND gate.

* * * * *